United States Patent
Tate et al.

(10) Patent No.: US 10,488,440 B2
(45) Date of Patent: Nov. 26, 2019

(54) COVER REMOVAL SWITCH HAVING LEVER-ARM

(71) Applicant: Landis+Gyr LLC, Lafayette, IN (US)

(72) Inventors: Ronald C. Tate, Battle Ground, IN (US); Wojciech Janczak, West Lafayette, IN (US)

(73) Assignee: Landis+Gyr LLC, Lafayette, IN (US)

( * ) Notice: Subject to any disclaimer, the term of this patent is extended or adjusted under 35 U.S.C. 154(b) by 644 days.

(21) Appl. No.: 14/750,566

(22) Filed: Jun. 25, 2015

(65) Prior Publication Data

US 2015/0377927 A1 Dec. 31, 2015

Related U.S. Application Data

(60) Provisional application No. 62/017,178, filed on Jun. 25, 2014.

(51) Int. Cl.
*G01R 11/24* (2006.01)
*G01R 11/04* (2006.01)

(52) U.S. Cl.
CPC ............. *G01R 11/24* (2013.01); *G01R 11/04* (2013.01)

(58) Field of Classification Search
CPC ................................. G01R 11/24; G01R 11/04
See application file for complete search history.

(56) References Cited

U.S. PATENT DOCUMENTS

| | | | |
|---|---|---|---|
| 5,140,258 A * | 8/1992 | Bishop | G08B 13/06 324/110 |
| 6,054,930 A * | 4/2000 | Guillon | G01F 15/007 324/110 |
| 2004/0093917 A1 * | 5/2004 | Sullivan | E05B 65/0089 70/164 |

* cited by examiner

*Primary Examiner* — Akm Zakaria
(74) *Attorney, Agent, or Firm* — Kilpatrick Townsend & Stockton LLP

(57) ABSTRACT

A meter cover removal detection arrangement includes a switch element, a pivoting lever arm, a meter cover and a plunger. The switch element has first and second positions, and conducts electricity between first and second contacts in only one of the first position and the second position. The pivoting lever arm has two arm positions, and is operably coupled to cause the switch element to be in the second position when the lever arm is in a second arm position. The lever arm engages a spring that biases the level arm toward the second arm position. The meter cover has an inward extending cam. The plunger has first and second plunger positions, and is operably coupled to hold the pivoting lever arm in the first arm position when the plunger is in the first plunger position. The cam engages the plunger to hold the plunger in the first plunger position when the meter cover is installed on a meter base. The cam is disengaged from the plunger when the meter cover is removed.

20 Claims, 4 Drawing Sheets

COVER REMOVAL SWITCH HAVING LEVER-ARM

The present invention claims the benefit of U.S. Provisional Patent Application Ser. No. 62/017,178, filed Jun. 25, 2014, which is incorporated herein by reference.

FILED OF THE INVENTION

The present invention generally relates to an electrical meter; more particularly, the present invention relates to a system for detecting the removal of a cover from an electrical meter.

BACKGROUND OF THE INVENTION

There is a need for devices that detect tampering with utility meters. Tampering with utility meters can cause damage to equipment, injury, and loss of revenue. One common type of meter tampering involves opening the sealed meter cover to either disable the counting/registration device or to divert a resource (such as water or electricity). By diverting the resource past the meter (i.e. bypassing the meter), the resource may be consumed without recordation or registration for billing purposes.

While meters are crafted in a way such that opening the meter cover is difficult, it is not practical or likely possible to create a meter cover that cannot be removed. Indeed, at least one consideration is that an authorized meter technician may be required to open the meter cover at some point. Therefore, the meter closure cannot be impenetrable. Accordingly, a main strategy in tamper protection is to detect and flag an unauthorized removal of the meter cover. Because meters are periodically read, either in person or remotely, the flagging of a meter tamper event allows for relatively timely indication that tampering has occurred. Alternatively, meters with automated meter reading communication devices may communicate an indication of the opening event remotely. Upon receiving evidence of a tamper event, the situation can be corrected.

Traditionally, mechanical seals have been placed between the meter base assembly and its cover to inhibit unauthorized access. In such cases, a broken seal can indicate a tamper event. This protection mechanism, although sufficient on meters employing primary mechanical counters, may not provide adequate protection for electronic meters. In particular, electronic meters can often be read remotely (e.g. using AMR), or at least without close inspection of the meter. Accordingly, if an electronic meter has the ability to report metering data remotely, there may seldom be an opportunity for a meter technician to observe a broken seal at the location of the meter.

There is a need, therefore, for electronic tamper detection that does not require, or at least rely exclusively on, a mechanical seal.

BRIEF SUMMARY OF THE INVENTION

One or more of the embodiments of the present invention provide an arrangement that includes a meter cover with an inward extending cam arranged to engage a plunger of a switch. Removal of the cover causes the cam to disengage the switch, which causes a change in a signal provided to a processing circuit. The processing circuit detects the change in signal and determines a cover removal event.

In one embodiment, a meter cover removal detection arrangement includes a switch element, a pivoting lever arm, a meter cover and a plunger. The switch element has first and second positions, and conducts electricity between first and second contacts in only one of the first position and the second position. The pivoting lever arm has two arm positions, and is operably coupled to cause the switch element to be in the second position when the lever arm is in a second arm position. The lever arm engages a spring that biases the level arm toward the second arm position. The meter cover has an inward extending cam. The plunger has first and second plunger positions, and is operably coupled to hold the pivoting lever arm in the first arm position when the plunger is in the first plunger position. The cam engages the plunger to hold the plunger in the first plunger position when the meter cover is installed on a meter base. The cam is disengaged from the plunger when the meter cover is removed.

The above-described features and embodiments, as well as others, will become more readily apparent to those of ordinary skill in the art by reference to the following detailed description and accompanying drawings.

DETAILED DESCRIPTION OF THE INVENTION

Figure 1:
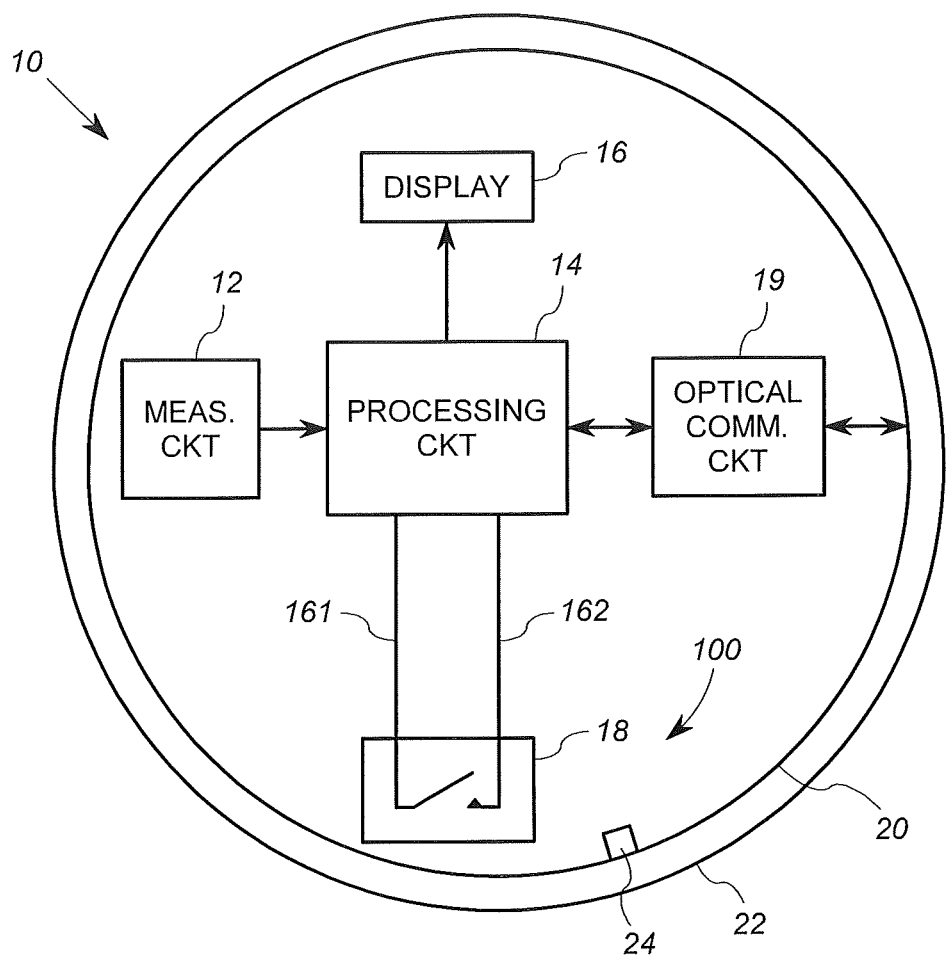
FIG. 1 illustrates a representative schematic diagram of an exemplary electricity meter that incorporates an arrangement for meter cover removal detection according to the invention.

FIG. 1 shows a representative schematic diagram of an exemplary electricity meter 10 that incorporates an arrangement 100 for meter cover removal detection according to the invention. The electricity meter 10 includes measurement circuitry 12, a processing circuit 14, a display 16, a switch 18 and optical communication circuitry 19, all disposed on or supported by or within a structure 20. The meter 10 also includes a cover 22 having a cam 24.

The measurement circuit 12 includes voltage and/or current sensors, analog to digital conversion circuitry, and other circuitry configured to generate digital measurement and/or energy signals from power lines, not shown. Such circuits for electronic meters are well known in the art. The processing circuit 14 is a circuit that performs control functions with the meter 10, and in many cases performs further processing on the digital measurement signals generated by the measurement circuit 12. For example, the processing circuit 14 may convert raw digital measurement information into a format that is displayable, or convert energy information to derivative types of energy consumption information, such as those related to time-of-use metering and/or demand metering which are known in the art. In another embodiment, the meter 10 includes a remote communication circuit, as is known in the art, and the processing circuit 14 would communicate metering data to a remote location via such a communication circuit.

It will be appreciated that the exact physical configuration of the measurement circuit 12 and the processing circuit 14 is not important to the implementation of the invention, and this embodiment of the invention may be used in a wide variety of meters that include digital processing circuitry. While the processing circuit 14 includes the specific additional functionality related to cover removal detection described herein, it may otherwise include known processing circuit structures and functionalities. Suitable embodiments of the measurement circuit 12 and such a processing circuit are described, for example, in U.S. patent applications Ser. No. 12/777,244 filed May 10, 2010, Ser. No. 12/537,885, filed Aug. 7, 2009, and Ser. No. 12/652,007, filed Jan. 4, 2010, all of which are incorporated herein by reference.

The display 16 in this embodiment is an LCD display 16 that provides visible display of information as controlled by the processing circuit 14. Such display devices are known in the art and may take many forms.

The switch 18 in this embodiment includes a spring-biased, lever arm switch, which is shown in further detail below in connection with FIGS. 4 and 5, and which is moveable between a first (i.e. open) position and a second (i.e. closed) position. In this embodiment, the switch 18 conducts electricity between first and second contacts 161, 162 in the second position, and opens the circuit between the first and second contacts 161, 162 in the first position. Further detail regarding the switch 18 and the contacts are provided below in connection with FIGS. 4 and 5.

The structure 20 is a support structure for the meter 10 apart from the cover 22. The structure 20 may include one or more printed circuit boards of the meter 10 in this embodiment. (See, e.g., printed circuit 160 of FIGS. 4 and 5). In general, when a meter cover 22 is removed from the meter, the structure 20 would be the physical support, including the meter base 54 (see FIGS. 2 and 3), from which the meter cover 22 is removed.

Accordingly, the meter cover 22 is a device that forms a protective cover over the electronic elements 12, 14, 16 and 18 supported by the structure 20. The meter cover 22 is at least partially transparent to allow reading of the display 16. In many cases, the cover 22 and the structure 20 include mating elements, not shown to facilitate securing the cover 22 onto the structure 20. Such mating elements typically require at least some rotation of the meter cover 22 after it has been placed on a corresponding portion of the structure 20. Meter covers that secure to a meter base via a rotational locking procedure are well known in the art.

The cam 24 is attached to, or integrally formed on, an interior wall of the meter cover 22. The cam 24 is generally disposed such that when the meter cover 22 is fully installed, the cam 24 aligns with features on the switch 18 which causes the switch 18 to be in the first position. The cam 24 is also disposed such that when the cover 22 is not fully installed, i.e. removed, or partly removed, the cam 24 does not align with the features of the switch, 18, and thus no longer causes the switch to be in the first position.

Figure 2:
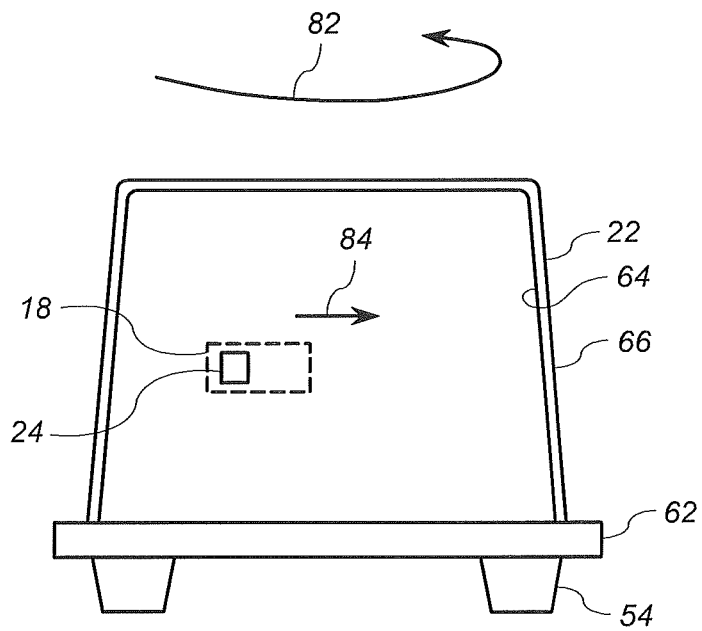
FIG. 2 illustrates a representative plan view of an embodiment of the invention in which the cover of the electricity meter of FIG. 1 is in fully closed position.
Figure 3:
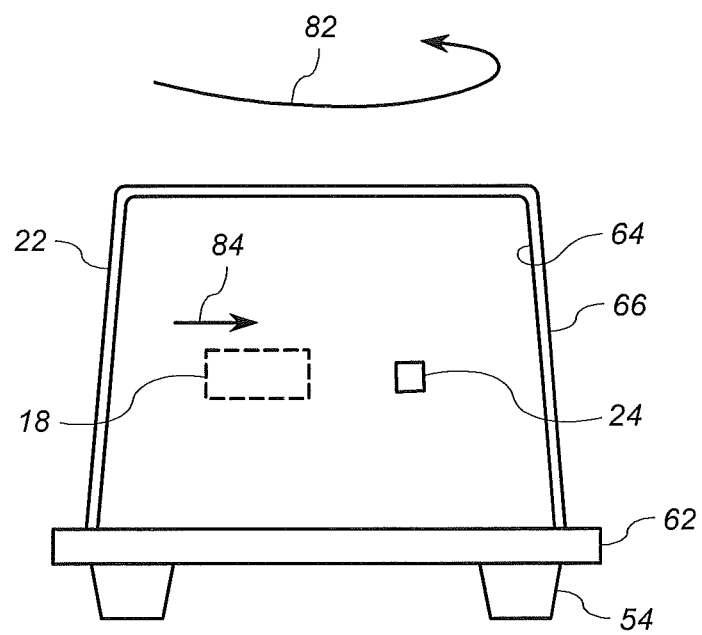
FIG. 3 illustrates a representative plan view of an embodiment of the invention in which the cover of the electricity meter of FIG. 1 is not in a fully closed position.

FIGS. 2 and 3 show representative schematic diagrams of the mechanical elements of the meter 10 of FIG. 1. More specifically, FIGS. 2 and 3 show schematic side plan views of the meter 10 of FIG. 2 in different stages of installation of the cover 22.

Referring now to FIG. 2, the meter cover 22 is a largely cylindrical (but slightly frustoconical) open bottom structure or container. The meter cover 22 defines an interior 64, and includes a main cylinder wall 66 and a bottom connecting portion 62. It will be appreciated that the cylinder wall 66 may also have a slightly tapered or frustoconical shape. The bottom connecting portion 62 includes a threaded interior surface, not shown. The threaded interior surface has threading configured to rotatably engage corresponding threads, also not shown, of the structure 20, as is known in the art of metering structures. In this embodiment, the meter cover 22 is made from a polycarbonate material. Details regarding the meter structure 20 and meter cover 22, other than those described herein, may be those common to any commercially available meter.

In this embodiment, the meter cover 22 includes a cam 24 extending inward from into the interior 64. The cam 24 is secured to the meter cover 22, such as by an adhesive. Alternatively, the cam 24 is integrally formed with the cover 22. The cam 24 is disposed in a position such that it can exert an inward force in a radially inward direction with respect to the cylindrical wall 66. The cam 24 is disposed in a position such that it aligns with the switch 18 when the meter cover 22 is in a secured state, or in other words, fully installed. The cam 24 is further disposed such that it is not aligned with the annular and axial position of the switch when the cover 22 is not in the fully installed and secured state.

The structure 20 includes a meter base 54, and at least one circuit board assembly such as the circuit board 160. As will be discussed below in connection with FIGS. 4 and 5, the structure 20 also includes a housing 180 that may or may not be part of the meter base 54. With simultaneous reference to FIGS. 2 and 4, the circuit board assembly 160 is disposed within the interior 64 and is supported on or by the meter base 54. The circuit board 160 in this embodiment includes circuit components 170. As will be discussed below, these components 170 can include all or part of the processing circuit 14, some or all of the optical communication circuitry 19, and a portion of the measurement circuit 12. Elements of the measurement circuit 12, such as for example, current coils, current transformers, and meter blades, are disposed on the underside of the meter base 54, not shown. The structure 20 may include other interior support structures for supporting the display 16.

Referring again to FIGS. 2 and 3, the switch 18, which in this embodiment is a biased lever arm switch, is mounted within the interior 64 of the cover 22 near a wall thereof. The switch 18 is mounted sufficiently close to the wall of the cover 22 so as to ensure that the cam 24 engages the switch 18 sufficient to change its state to the first (or closed) position when the cam 24 is in annular and axial alignment with the switch, as shown in FIG. 2.

With specific reference to the schematic plan view of FIG. 2, FIG. 2 shows the meter 10 in the fully installed position, that is, wherein the meter cover 22 is disposed in its final resting place for ordinary ongoing meter operations. As shown in FIG. 2, the cam 24 in this case is aligned with the switch 18, which is shown in phantom format. In the fully closed position of FIG. 2, the cam 24 is aligned with at least a portion of the switch 18 such that the cam 24 engages the switch 18.

It will further be appreciated that to remove the meter cover 22 from the base 54, the meter cover 22 must be rotated in the counter-clockwise direction 82. When rotating in such direction, the cam 24 moves in the direction 84 away from the switch 18. As will be discussed below in further detail in connection with FIGS. 4 and 5, this causes the cam 24 to be disengaged with the switch 18. FIG. 3 shows the meter 10 wherein the meter cover 22 has been partially rotated in the direction 82 as if to remove the meter cover 22.

As a result of this rotation, the cam 24 moves away from and disengages from the switch 18.

It will be appreciated that removal of the cover 22 by any other method will also cause the cam 24 to move away from and disengage the switch 18. Thus, if the meter cover 22 is destroyed in its removal (as opposed to rotating the cover 22 off), the cam 24 nevertheless stops engaging the switch 18.

In operation of the first embodiment, when the meter cover 22 is inserted on to the structure 20 (rotated onto the base 54 via the threads), the cam 24 moves in the direction opposite of direction 84. When the meter cover 22 is fully installed and secured, the cam 24 aligns with and engages the switch 18 as shown in FIG. 2. In such condition, the meter 10 may then be installed in the field. In this embodiment, the switch 18, which is biased to be normally closed, is forced into the open position by the cam 24.

During normal operation, the processing circuit 14 detects the status of the switch 18. Because the switch 18 is open, the processing circuit 14 detects no error or cover removal.

If the meter 10 is tampered with, specifically, by removing the cover 22, then the cam 24 will move away from and disengage the switch 18, as shown in FIG. 3. As a consequence, the normally closed switch 18 is free to change to the normally closed position. The change in switch position changes the signal detected by the processing circuit 14. The processing circuit 14 can thereby detect the cover removal. The processing circuit 14 detects this change and records a cover removal event.

In response to detecting a cover removal event, the processing circuit 14 may suitably cause a display of a tamper or cover removal indicator or code on the meter display 16. In embodiments in which the processing circuit 14 is capable of remote communications, the processing circuit 14 can cause transmission of information indicating a cover removal event to a remote device.

It will be appreciated that if the meter cover 22 is removed during a power outage, the cover removal event can in some embodiments be detected by the processing circuit 14 running in a sleep mode. In such a sleep mode, the processing circuit 14 perform minimal operations, including those that detect when the switch 18 is closed. Upon detection of the closing of the switch 18, the processing circuit 14 can record a cover removal or tamper event. The processing circuit 14 may then display or communicate the detection of the event upon the restoration of power. Even if the processing circuit 14 does not have a sleep mode, the processing circuit 14 can detect the closed stated of the switch 18 upon restoration of the power if the cover 22 is still removed.

Accordingly, it will be appreciated that the above described arrangement allows for detection of a meter cover removal event in an electronic meter, even when power is removed from the meter. Because the arrangement provides a detectable connection/signal to a digital processing circuit, the cover removal event indication may transmitted if the meter includes remote communication capability. In the embodiment described above, the cover removal event may also be communicated to an external device by the optical communication circuit 19.

It will be appreciated that in other embodiments, the switch 18 may be normally open, and thus nonconductive when the meter cover 22 is not fully installed. However, use of a normally closed switch 18 can reduce back-up power consumption during a power outage by maintaining an open circuit between the contacts 161, 162 while the cover 22 is installed.

Figure 4:
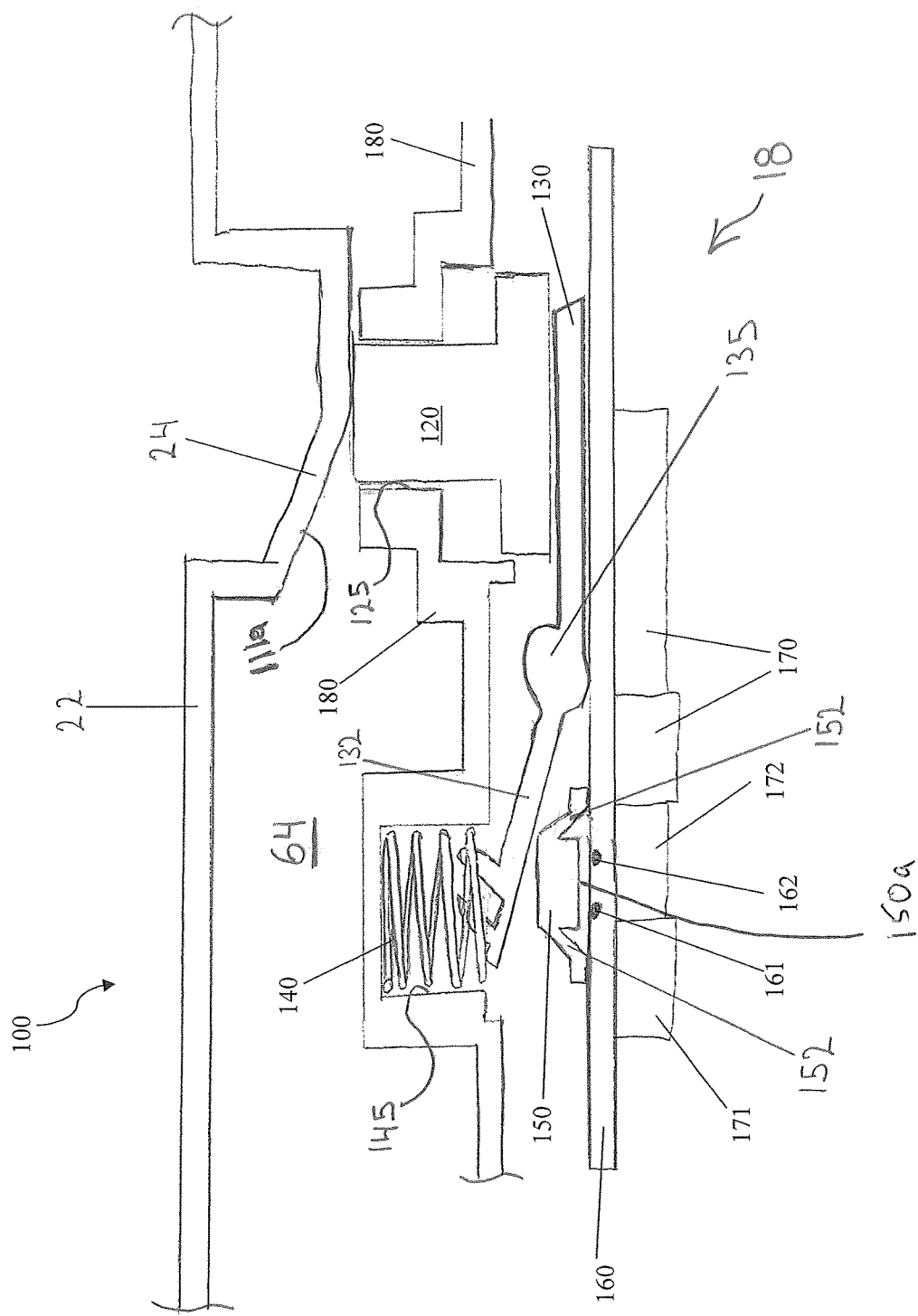
FIG. 4 illustrates in further detail a fragmentary plan view of the arrangement for detecting cover removal of the meter of FIG. 1 when the cover is in the fully closed position.
Figure 5:
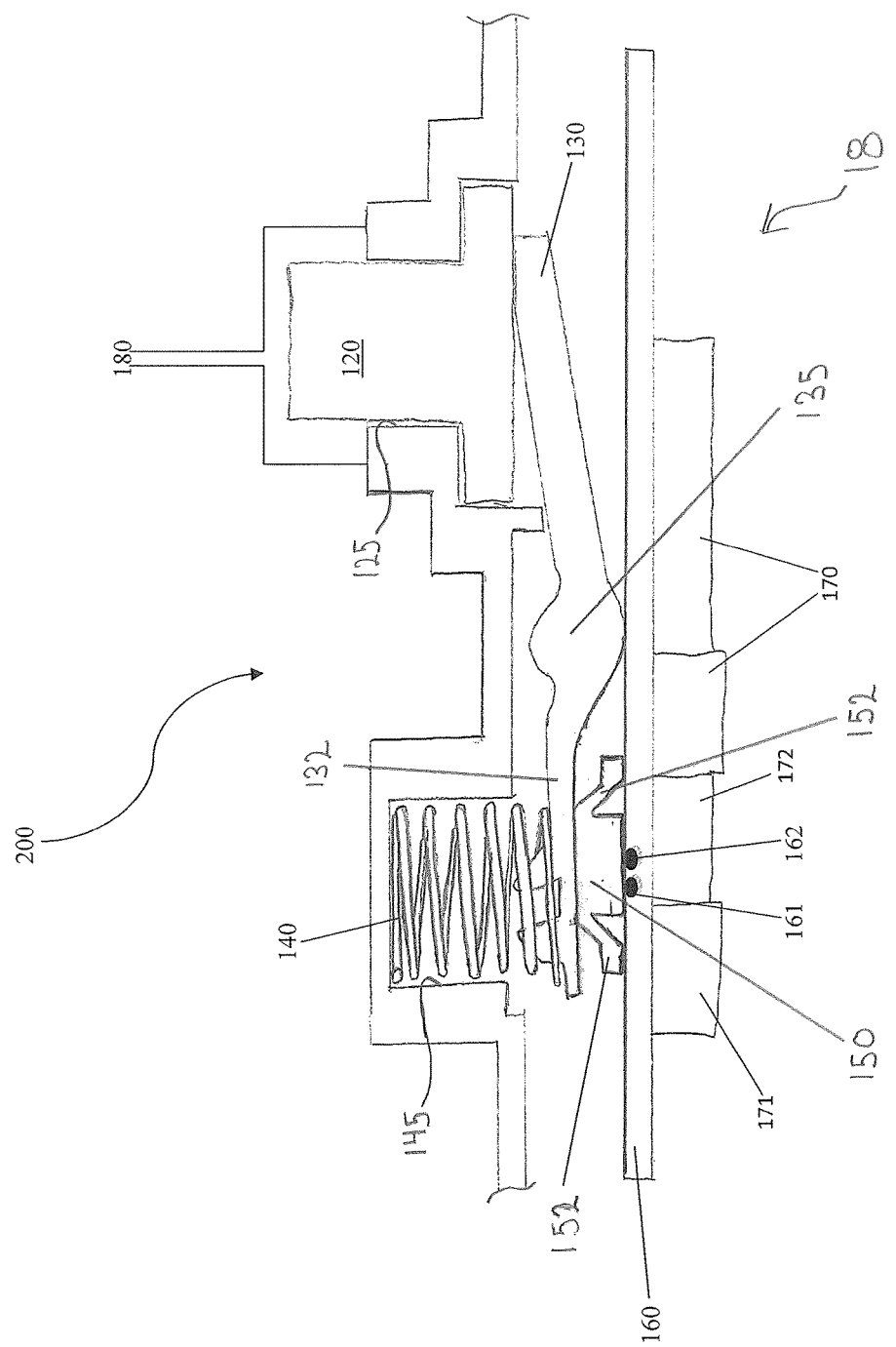
FIG. 5 illustrates in further detail a fragmentary plan view of the arrangement for detecting cover removal of the meter of FIG. 1 when the cover is not in the fully closed position.

FIGS. 4 and 5 show in further detail a fragmentary plan view of the arrangement 100 for detecting the removal of a cover from an electricity meter according to an embodiment of the present invention. FIG. 4 shows the arrangement 100 with the switch 18 in the first position, corresponding to FIG. 2, and FIG. 5 shows the arrangement 100 with the switch 18 in the second position, corresponding to FIG. 3.

As shown in FIGS. 4 and 5, the arrangement 100 includes the meter cover 22, a plunger 120, a pivot-arm 130, a spring 140, a conductive switch element 150, the printed circuit board (PCB) 160, and housing 180. As discussed above, the meter cover 22 includes a cam 24 that extends inwards towards the meter interior. The cam 24 includes an inclined surface 111a that allows the cam to perform a camming action on the plunger 120 as the cam 24 rotates from right to left when the meter cover 22 is installed onto the meter base 54 (See FIG. 2).

The PCB 160 includes a first and second contact 161 and 162 respectively and a plurality of circuit components 170 including the processing circuit 14 of FIG. 1. As shown in FIG. 1, the contacts 161 and 162 are part of a circuit that provides a first signal to the processing circuit 14 when they shorted (i.e. by the conductive switch element 150), and provides a second signal (or no signal) when they are open.

The housing 180 is a structure that is also located in the interior 64 of the cover 22, forms part of the meter structure 20 of FIGS. 2 and 3, and is directly or indirectly affixed to the meter base 54. In some cases, the housing 180 is part of an inner cover that has the general shape of the meter cover 22, and which is also located in the interior 64. However, it will be appreciated that the housing 180 may take the form of other structures rigidly supported on or with the meter base 54 (see FIG. 2).

In general, the meter cover 22 has a final, installed (or fully closed) position and a plurality of non-final positions on the housing 180. The final position is associated with an installed and operating meter. (See, e.g. FIG. 1). In such a case, the meter cover 22 is fixedly mated with the housing 180. For example, because the meter cover 22 and the meter base 54 in this embodiment are threaded, then the final position is when the meter cover 22 is fully rotated to its maximum extent (fully closed position) on the base 54 (See FIG. 2). In such a position, additional sealing elements may or may not be used to inhibit rotating the meter cover 22 in the opposite direction for the purposes of removal. A non-final position, as used herein, means any position of the meter cover 22 with respect to the housing 180 that is not in the final position, such as, by way of non-limiting example, when the cover 22 is at any stage of rotation toward removal. (See, e.g. FIG. 3).

The meter cover 22 in embodiments described herein differs from those generally known in the art to include the cam 24 that extends inward towards the interior 64 of the meter 10, and indeed toward other components of the arrangement 100. When the meter cover 22 is in its full closed position, as shown in FIG. 4, the cam 24 presses the plunger 120 into its fully downward position. Because the meter cover 22 is rotated into its final, fully closed position, the cam 24 in this embodiment includes an inclined surface 111a that first engages the plunger 120 during rotation. The inclined surface 111a increasingly compresses the plunger 120 as the meter cover 22 is twisted into position. Alternatively, the same effect could be achieved by disposing the cam 24 perpendicularly to the rotation axis of the meter cover 22 and include an oblique or inclined surface on the plunger 120

The plunger 120 has a T-shaped cross-section in the plane shown in FIGS. 1 and 2. The housing 180 has corresponding receptacle 125 that retain the plunger 120, and allow for radial (with respect to the meter axis) travel of the plunger 120 between a first plunger position (FIG. 4) and a second plunger position (FIG. 5). In the plane parallel to the top surface of the PCB 160, the plunger 120 has a square cross section in the present embodiment; however the system functions with plungers having a cross-section in this direction of other shapes. The narrow portion of the T-shaped plunger 120 extends through the receptacle 125 of the housing 180 and engages the cam 24 of the meter cover 22. The wide portion of the T-shaped plunger 120 is operably coupled to the pivot-arm 130.

The pivot-arm 130 extends outward in two directions from an intermediate pivot point 135. In the first direction, the pivot-arm 130 is operably coupled to the plunger 120. In the other direction, the pivot-arm 130 is operably coupled to or at least engages the spring 140. In this embodiment, the side of the pivot arm 130 closest to the spring has a bottom surface that engages the conductive switch element 150 at least when the pivot arm 130 in its second pivot position.

In one embodiment the pivot-arm 130 is formed of a very stable glass-filled thermoplastic resin. The glass-filled thermoplastic resin used has a high resistance to creep at high temperatures and high levels of humidity. This allows the switch 18 to be resilient under extreme conditions within the meter. In one embodiment the pivot-arm 130 is attached to the housing 180 by a snap feature, not shown, for ease of manufacturing.

When the meter cover 22 is removed, the pivot-arm 130 pivots about its pivot point 135 and engages (or, if already attached, moves) the conductive switch element 150. In one embodiment, the pivot-arm 130 pivots 20 degrees between the cover 22 fully closed state (FIG. 1) and the cover 22 removed state (FIG. 2).

The spring 140 in the present embodiment is a helical, metal spring. In alternative embodiments the spring 140 could be any elastic component capable of applying a force sufficient to engage the switch (200 grams in the present embodiment). On one end the spring 140 is engaged by the housing 180 within a receptacle 145. On the other end the spring 140 is engaged by the pivot-arm 130, either directly or indirectly through a linkage element, not shown.

In one embodiment, the conductive switch element 150 is a carbon-rubber switch, or at least includes a carbon rubber disk or element at its surface 150*a* opposite the PCB contacts 161, 162. A carbon-rubber switch is desirable because of its low activation force (approximately 200 grams). However, in other embodiments conductive switch element 150 could be any of several types of switches while retaining at least some of the advantages of the invention. In any event, the surface 150*a* of the conductive switch element 150 is of conductive material. When the cover is in its fully closed position as shown in FIG. 1, the conductive switch element 150 is open. By open, it is meant that the conductive surface 150*a* does not contact the PCB contacts 161, 162.

In this embodiment, the conductive switch element 150 is attached to the surface of the PCB 160 on either side of the contacts 161, 162 by wings 152. The wings 152 are made of resilient material and are coupled directly to the PCB 160. The wings 152 operate like resilient legs that normally bias the conductive switch element 150 away from the PCB contacts 161, 162 absent inward force applied to the element 150 towards the PCB 160. In lieu of wings 152, an annular, resilient ring/rim may be used, which may suitably have a cross section that is similar to the shape of the wings 152 shown in FIGS. 4 and 5.

As discussed above, the switch 18 (and element 150) is normally open during normal metering operations, when the plunger 120 engages the cam 24. Being normally open lowers the amount of wear on the conductive switch element 150. Being normally open also reduces the amount of energy being used by the cover removal detection arrangement 100. In particular, during a power outage, it is advantageous to continue to run a low level function that "wakes up" a microcontroller or other element of the processing circuit 14 when it receives a signal to indicate cover removal. If the switch is normally open, then when power is lost and the cover 22 is in place, no current flows through the contacts 161, 162 and back-up power can last a relatively long time. However, if the conductive switch element 150 were normally closed, then current would flow during a power outage at all times while the cover 22 was in its normal position, and the temporary back-up power would be quickly dissipated.

The printed circuit board (PCB) 160 in the present invention is substantially similar to the PCBs used in common electricity meters. On one surface (bottom in FIGS. 1 and 2) the PCB is connected to a plurality of circuit components 170 used in the normal operation of the electricity meter. In one embodiment, the circuit components include a microprocessor 171 and a memory unit 172, which may suitably form all or part of the processing circuit 14. It will be appreciated that the precise layout of the components 171, 172 on the PCB 160 is not important to the arrangement 100. The PCB 160 differs from the PCBs in a standard electricity meter on the other surface (top in FIGS. 3 and 4) on which it has two contacts 161 and 162 with which the conductive switch element 150 makes contact when in the closed position.

In one embodiment, the first contact 161 and second contact 162 are on the surface of the PCB 160. The first contact 161 is connected to a conductive trace, not shown, that provides an electrical current from a power source, not shown. The source of power may suitably be within the processing circuit 14. The second contact 162 is connected to a conductive trace, not shown, which is in turn connected to the microprocessor 171.

The circuit components 170 include the standard measuring circuitry 12 (see FIG. 1) currently used in electricity meters. In one embodiment the circuit components 170 includes voltage and/or current sensors, analog to digital conversion circuitry, and other circuitry configured to generate digital measurement and/or energy signals from power lines, not shown. Such circuits for electronic meters are well known in the art. In one embodiment the circuit components 170 also includes a processing circuit, a processing circuit is a circuit that performs control functions with the meter, and in many cases performs further processing on the digital measurement signals generated by the measurement circuit. For example, the processing circuit may convert raw digital measurement information into a format that is displayable, or convert energy information to derivative types of energy consumption information, such as those related to time-of-use metering and/or demand metering which are known in the art. In another embodiment, the circuit components 170 include a remote communication circuit, as is known in the art, and the processing circuit would communicate metering data to a remote location via such a communication circuit. It will be appreciated that the exact physical configuration of the circuit components 170 is not important to the implementation of the invention, and this embodiment of the invention may be used in a wide variety of meters that include digital processing circuitry. While the microprocessor 171 includes the specific additional functionality related to cover removal detection described herein, it may otherwise include known processing circuit structures and functionalities. Suitable embodiments of the measurement circuit and such a processing circuit included in the circuit components 170 are described, for example, in U.S. patent applications Ser. No. 12/777,244 filed May 10, 2010, Ser. No. 12/537,885, filed Aug. 7, 2009, and Ser. No. 12/652,007, filed Jan. 4, 2010, all of which are incorporated herein by reference.

As discussed above, the housing 180 is part of the support structure 20 for the meter 10. The housing 180 may be a part of the meter base 54, or alternatively, one or more other support structures fixed to the meter base 54. The housing 180 may include one or more printed circuit boards. The housing 180 includes a cavity 145 in which one end of the spring 140 is placed or a peg around which one end of the spring 140 is placed. In one embodiment the housing 180 further includes a section into which the pivot-arm 130 snaps into position. The housing 180 also includes the passage through which the narrow portion of the plunger 120 passes in order to make contact with the cam 24 of the meter cover 22.

FIG. 5 illustrates the arrangement 100 for detecting the removal of a cover from an electricity meter wherein the cover has been removed. When the cover 22 is removed, the cam 24 no longer impedes the upward travel of the plunger 120. Thus, the spring 140 can decompress to its normally biased position shown in FIG. 5. As a result, as shown in FIG. 5, the plunger 120 has been shifted upwards, away from the PCB 160. The pivot-arm 130 has rotated counter-clockwise by 20 degrees, and the spring 140 is in its non-compressed state. Because of the rotation of the pivot-arm 130, an end portion 132 of the pivot arm forces the conductive switch element 150 downward such that the surface 150a contacts the contacts 161, 162. In some embodiments, the spring 140 itself may force the conductive switch element 150 downward. In any event, the switch conductive surface 150a provides a connection between contacts 161 and 162 in the closed position.

In operation, in the fully-closed position, shown in FIG. 1, the cam 24 portion of the cover 22 applies a force on the plunger 120, which holds the plunger 120 in its first plunger position (towards the PCB 160). The plunger 120 in turn applies a force to the pivot-arm 130, rotating the side 132 away from the conductive switch element 150. The force of the plunger 120 translated through the pivot-arm 130 forces the spring 140 into a compressed state. In this position, the conductive switch element 150 is not pressed against the PCB 160. As a consequence, the wings 152 (or other resilient member of the switch element 150) decompress to pull the conductive surface 150a away from the electrical contacts 161, 162. As a consequence, there is no connection between electrical contacts 161 and 162 on the PCB 160. In an alternative embodiment, the conductive switch element 150 may be operably coupled to travel away from the PCB 160 via a direct or indirect connection with either the spring 140 or the pivot arm 130.

Referring to FIGS. 1 and 5 simultaneously, when the switch element 150 does not provide a connection between the contacts 161, 162, the switch 18 is open. The processing circuit 14 does not determine a cover removal event (unless by a different detection mechanism) while the circuit through the contacts 161, 162 is open.

When the cover 22 is removed, as shown in FIG. 5, the plunger 120 is no longer engaged by the cam 24 and thus is no longer retained in its first plunger position shown in FIG. 4. Accordingly, the spring 140 applies a force to the pivot-arm 130 pressing it down. The spring force is translated to force the conductive switch element 150 toward the PCB 160, and the conductive surface 150a onto the contacts 161, 162. The spring force may be translated via the pivot arm 130 itself, via the spring 140 itself, or by some intermediate device coupled to the spring 140 or the pivot arm 130. When engaged, the conductive switch element 150 enters its closed state and provides a connection between the contacts 161 and 162.

An electric current flows from the first contact 161, through the conductive switch element 150 to the second contact 162 and then from the second contact 162 to the processing circuit 14. The processing circuit 14 detects a different signal when the first contact 161 and the second contact 162 are connected (as opposed to when they are disconnected). The processing circuit 14 determines the existence of a cover removal event responsive to the detection of that signal, for example, by setting a cover removal flag in local memory. In the embodiment of FIG. 5, for microprocessor 171 detects the signal caused by the connection of the first contact 161 and the second contact 162 (via electrical signals) and then stores data representing this signal in the memory unit 172. In one embodiment, the data stored in the memory unit 172 is transmitted via the remote communication circuitry included in the circuit components 170 to a remote processing center. In another embodiment, the processing circuit 14 causes an indication notifying of the cover removal on the display 16. When in the cover removed state illustrated in FIG. 5, the pivot-arm 130 applies a force to the plunger 120 moving the plunger 120 to its second plunger position away from the PCB 160.

In another embodiment, the conductive switch element 150 is engaged by the spring 140 when the cover 22 is removed. When the cover 22 is removed, the force being applied to the spring 140 by the pivot arm 130 is also removed. The spring 140 expands downward, towards the PCB 160, and engages the conductive switch element 140.

In another embodiment, the spring 140 is a leaf spring. The apparatus functions in the same way with a leaf spring as it does with the helical spring.

It will be appreciated that various alternatives may be implemented that incorporate the principles of the present invention and fall within the spirit and scope thereof.

What is claimed is:

1. A meter cover removal detection arrangement, comprising:
    a switch element having a first position and a second position, the switch element conducting electricity between first and second contacts in only one of the first position and the second position;
    a pivoting lever arm having a first arm position and a second arm position, the pivoting lever arm operably coupled to cause the switch element to be in the second position when the pivoting lever arm is in a second arm position, the pivoting lever arm engaging a spring, the spring biasing the pivoting lever arm toward the second arm position;
    a meter cover having an inward extending cam; and
    a plunger having a first plunger position and a second plunger position, the plunger operably coupled to hold the pivoting lever arm in the first arm position when the plunger is in the first plunger position;
    wherein the cam engages the plunger to hold the plunger in the first plunger position when the meter cover is installed on a meter base, and the cam is disengaged from the plunger when the meter cover is removed.

2. The meter cover removal detection arrangement of claim 1, wherein the spring holds the pivoting lever arm in the second arm position when the cam is disengaged from the plunger.

3. The meter cover removal detection arrangement of claim 1, wherein the switch element is disposed in the first position when the pivoting lever arm is in the first arm position.

4. The meter cover removal detection arrangement of claim 1, wherein
the meter cover includes threads for rotatably engaging the meter base,
the meter cover has a fully closed position;
the cam engages the plunger when the meter cover is in the fully closed position; and
the cam disengages the plunger when the meter cover is rotated away from the fully closed position.

5. The meter cover removal detection arrangement of claim 4, wherein the switch element is disposed in the first position when the pivoting lever arm is in the first arm position.

6. The meter cover removal detection arrangement of claim 5, wherein the switch element includes a resilient biasing mechanism configured to bias the switch element away from the first and second contacts.

7. The meter cover removal detection arrangement of claim 6, wherein the first and second contacts are disposed on a structure rigidly coupled to the meter base, and wherein the resilient biasing mechanism is attached to the structure.

8. The meter cover removal detection arrangement of claim 4, wherein the cam includes an inclined surface that engages the plunger when the meter cover is in a position adjacent to the fully closed position.

9. The meter cover removal detection arrangement of claim 1, wherein the first and second contacts are disposed on a structure rigidly coupled to the meter base.

10. A meter cover removal detection arrangement, comprising:
a switch element having a first position and a second position, the switch element conducting electricity between first and second contacts in only one of the first position and the second position, the first and second switch contacts disposed on a printed circuit board;
a lever arm having a first arm position and a second arm position, the lever arm operably coupled to cause the switch element to be in the second position when the lever arm is in a second arm position, the lever arm engaging a spring, the spring biasing the lever arm toward the second arm position;
a meter cover having an inward extending cam; and
a plunger having a first plunger position and a second plunger position, the plunger operably coupled to hold the pivoting lever arm in the first arm position when the plunger is in the first plunger position;
wherein the cam engages the plunger to hold the plunger in the first plunger position when the meter cover is installed on a meter base, and the cam is disengaged from the plunger when the meter cover is removed.

11. The meter cover removal detection arrangement of claim 10, wherein the first contact is a conductive trace on a printed circuit board.

12. The meter cover removal detection arrangement of claim 10, wherein the switch element includes a conductive element that in the second position is electrically connected to both the first contact and the second contact, and that in the first position is electrically disconnected from both the first contact and the second contact.

13. A meter cover removal detection arrangement, comprising:
a switch element having a first position and a second position, the switch element conducting electricity between first and second contacts in only one of the first position and the second position;
a lever arm having a first arm position and a second arm position, the lever arm operably coupled to cause the switch element to be in the second position when the lever arm is in a second arm position, the lever arm engaging a spring, the spring biasing the lever arm toward the second arm position;
a cover of an electricity meter, the cover having an inward extending cam secured thereto; and
a plunger having a first plunger position and a second plunger position, the plunger operably coupled to hold the lever arm in the first arm position when the plunger is in the first plunger position;
wherein the cam engages the plunger to hold the plunger in the first plunger position when the cover is installed on a meter base, and the cam is disengaged from the plunger when the cover is removed.

14. The meter cover removal detection arrangement of claim 13, wherein the cover rotatably and threadingly engages the meter base.

15. The meter cover removal detection arrangement of claim 14, wherein:
the cover has a fully closed position on the meter base;
the cam engages the plunger when the meter cover is in the fully closed position; and
the cam disengages the plunger when the meter cover is rotated away from the fully closed position.

16. The meter cover removal detection arrangement of claim 15, wherein the first and second switch contacts disposed on a printed circuit board.

17. The meter cover removal detection arrangement of claim 16, wherein the spring holds the lever arm in the second arm position when the cam is disengaged from the plunger.

18. The meter cover removal detection arrangement of claim 13, wherein the switch element is disposed in the first position when the lever arm is in the first arm position.

19. The meter cover removal detection arrangement of claim 13, wherein the first contact is a conductive trace on a printed circuit board.

20. The meter cover removal detection arrangement of claim 13, wherein the first and second contacts are disposed on a structure rigidly coupled to the meter base.

* * * * *